US010641665B2

(12) United States Patent
Genmei et al.

(10) Patent No.: US 10,641,665 B2
(45) Date of Patent: May 5, 2020

(54) PIEZOELECTRIC DEFLECTION SENSOR AND DETECTION DEVICE

(71) Applicant: Murata Manufacturing Co., Ltd., Nagaokakyo-shi, Kyoto-fu (JP)

(72) Inventors: Yuya Genmei, Nagaokakyo (JP); Shingo Chida, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 272 days.

(21) Appl. No.: 15/955,730

(22) Filed: Apr. 18, 2018

(65) Prior Publication Data
US 2018/0238752 A1 Aug. 23, 2018

Related U.S. Application Data

(63) Continuation of application No. PCT/JP2016/082319, filed on Oct. 31, 2016.

(30) Foreign Application Priority Data

Nov. 13, 2015 (JP) .................................. 2015-222613

(51) Int. Cl.
*G01L 1/16* (2006.01)
*G01B 7/16* (2006.01)
(Continued)

(52) U.S. Cl.
CPC ................. *G01L 1/16* (2013.01); *G01B 7/16* (2013.01); *H01L 41/047* (2013.01);
(Continued)

(58) Field of Classification Search
CPC ..... G01L 1/16; H01L 41/047; H01L 41/1132; H01L 41/083; H01L 41/0477; H01L 41/053; G01B 7/16
See application file for complete search history.

(56) References Cited

U.S. PATENT DOCUMENTS 5,786,655 A * 7/1998 Okumura ............ H01L 41/0471
310/328
5,824,904 A 10/1998 Kouhei et al.
(Continued)

FOREIGN PATENT DOCUMENTS

JP 62-53364 U 4/1987
JP 62-156503 U 10/1987
(Continued)

OTHER PUBLICATIONS

Official Communication issued in International Patent Application No. PCT/JP2016/082319, dated Jan. 17, 2017.

*Primary Examiner* — David Z Huang
(74) *Attorney, Agent, or Firm* — Keating & Bennett, LLP

(57) ABSTRACT

A piezoelectric deflection sensor includes a first piezoelectric plate having a polarization axis direction that is parallel to first and second principal surfaces, first and second segmented electrodes provided on the first principal surface of the first piezoelectric plate, and third and fourth segmented electrodes provided on the second principal surface of the first piezoelectric plate. A piezoelectric element is defined by the first piezoelectric plate and the first to fourth segmented electrodes. The first segmented electrode and the third segmented electrode oppose each other across the first piezoelectric plate, and the second segmented electrode and the fourth segmented electrode oppose each other across the first piezoelectric plate. The first segmented electrode and the fourth segmented electrode are electrically connected to each other, and the second segmented electrode and the third segmented electrode are electrically connected to each other.

20 Claims, 12 Drawing Sheets

(51) Int. Cl.
  *H01L 41/047* (2006.01)
  *H01L 41/053* (2006.01)
  *H01L 41/083* (2006.01)
  *H01L 41/113* (2006.01)
  *H01L 41/04* (2006.01)
  *H01L 41/187* (2006.01)

(52) U.S. Cl.
  CPC ........ *H01L 41/0477* (2013.01); *H01L 41/053* (2013.01); *H01L 41/083* (2013.01); *H01L 41/1132* (2013.01); *H01L 41/042* (2013.01); *H01L 41/1876* (2013.01)

(56) References Cited

U.S. PATENT DOCUMENTS

2009/0235762 A1* 9/2009 Schaffner ............... B23K 20/10
    73/862.68
2012/0319418 A1   12/2012 Nishiwaki
2018/0306655 A1* 10/2018 Cavalloni ................. G01L 1/16

FOREIGN PATENT DOCUMENTS

| JP | 07/253441 A | 10/1995 |
| JP | 11-230837 A | 8/1999 |
| JP | 2009-295788 A | 12/2009 |
| JP | 2014-062918 A | 4/2014 |

* cited by examiner

PIEZOELECTRIC DEFLECTION SENSOR AND DETECTION DEVICE

CROSS REFERENCE TO RELATED APPLICATIONS

This application claims the benefit of priority to Japanese Patent Application No. 2015-222613 filed on Nov. 13, 2015 and is a Continuation Application of PCT Application No. PCT/JP2016/082319 filed on Oct. 31, 2016. The entire contents of each application are hereby incorporated herein by reference.

BACKGROUND OF THE INVENTION

1. Field of the Invention

The present invention relates to a piezoelectric deflection sensor and a detection device to detect a deflection of a substrate or other structure.

2. Description of the Related Art

As a sensor which detects a deflection of a substrate or other structure, there is conventionally known a piezoelectric sensor using a d31 mode, for example, as disclosed in Japanese Patent Laid-Open No. 62-156503.

A piezoelectric sensor disclosed in Japanese Patent Laid-Open No. 62-156503 has a bimorph structure. The piezoelectric sensor includes an upper layer piezoelectric thin film and a lower layer piezoelectric thin film. When it detects a deflection, an output of the upper layer piezoelectric thin film and an output of the lower layer piezoelectric thin film are measured, and for example, the upper layer output is corrected. Thus, upper layer charge and lower layer charge that arise from the pyroelectric effect of the piezoelectric sensor are offset.

However, with the piezoelectric sensor disclosed in Japanese Patent Laid-Open No. 62-156503, the upper layer output and the lower layer output are required to be measured, and furthermore, a correction circuit must be provided. Accordingly, detection efficiency has been poor.

SUMMARY OF THE INVENTION

Preferred embodiments of the present invention provide piezoelectric deflection sensors and detection devices capable of detecting a deflection with high detection efficiency.

A piezoelectric deflection sensor according to a preferred embodiment of the present invention, includes a first piezoelectric plate including a first principal surface and a second principal surface opposing the first principal surface, having a rectangular, substantially rectangular, square, or substantially square plan shape, and having a polarization axis direction being parallel or substantially parallel to the first and second principal surfaces and being a direction along any side of the plan shape; first and second segmented electrodes provided on the first principal surface of the first piezoelectric plate and arranged along the polarization axis direction of the first piezoelectric plate across a first electrode non-formation region extending in a direction intersecting the polarization axis direction of the first piezoelectric plate; and third and fourth segmented electrodes provided on the second principal surface of the first piezoelectric plate and disposed along the polarization axis direction of the first piezoelectric plate across a second electrode non-formation region extending in a direction intersecting the polarization axis direction of the first piezoelectric plate, wherein a piezoelectric element includes the first piezoelectric plate and the first to fourth segmented electrodes, the first and second principal surfaces opposing each other, first and second lateral surfaces opposing each other, and first and second end surfaces opposing each other, the first segmented electrode and the third segmented electrode oppose each other across the first piezoelectric plate, and the second segmented electrode and the fourth segmented electrode oppose each other across the first piezoelectric plate, and the first segmented electrode, the fourth segmented electrode are electrically connected to each other, and the second segmented electrode and the third segmented electrode are electrically connected to each other.

A piezoelectric deflection sensor according to a preferred embodiment of the present invention, includes a first external electrode electrically connecting the first segmented electrode and the fourth segmented electrode to each other, and a second external electrode electrically connecting the second segmented electrode and the third segmented electrode to each other.

In a piezoelectric deflection sensor according to a preferred embodiment of the present invention, the first and second electrode non-formation regions extend in a direction perpendicular or substantially perpendicular to the polarization axis direction of the first piezoelectric plate.

In a piezoelectric deflection sensor according to a preferred embodiment of the present invention, the first to fourth segmented electrodes are not exposed from the first or second lateral surface of the piezoelectric element. In this case, impurities are unlikely to adhere to the first to fourth segmented electrodes or between the first to fourth segmented electrodes. Therefore, an insulation resistance is unlikely to decrease.

In a piezoelectric deflection sensor according to a preferred embodiment of the present invention, the piezoelectric element includes a second piezoelectric plate stacked on the first piezoelectric plate, and a polarization axis direction of the second piezoelectric plate is a reverse direction to the polarization axis direction of the first piezoelectric plate, and fifth and sixth segmented electrodes arranged along the polarization axis direction of the second piezoelectric plate across a third electrode non-formation region extending in a direction intersecting the polarization axis direction of the second piezoelectric plate are provided on an opposite surface, of the second piezoelectric plate, to a surface thereof on the first piezoelectric plate side. In this case, charge sensitivity of the piezoelectric deflection sensor is further improved.

In a piezoelectric deflection sensor according to a preferred embodiment of the present invention, a package substrate is stacked on at least one of the first principal surface and the second principal surface of the piezoelectric element. In this case, the strength of the piezoelectric deflection sensor is improved.

In a piezoelectric deflection sensor according to a preferred embodiment of the present invention, the package substrate includes first and second package substrates, the first package substrate is stacked on the first principal surface of the piezoelectric element, and the second package substrate is stacked on the second principal surface of the piezoelectric element. In this case, the strength of the piezoelectric deflection sensor is further improved.

In a piezoelectric deflection sensor according to a preferred embodiment of the present invention, a groove extending in a direction intersecting the polarization axis direction of the first piezoelectric plate is provided in the second package substrate at a position overlapping with at least a portion of the second electrode non-formation region in plan view. In this case, stress due to a deflection of a target of detection is efficiently exerted on the first piezoelectric plate. Accordingly, detection efficiency of a deflection by the piezoelectric deflection sensor is further improved, and charge sensitivity is improved.

In a piezoelectric deflection sensor according to a preferred embodiment of the present invention, the groove extends in a direction perpendicular or substantially perpendicular to the polarization axis direction of the first piezoelectric plate.

In a piezoelectric deflection sensor according to a preferred embodiment of the present invention, the groove is positioned at a center or approximate center in the polarization axis direction of the first piezoelectric plate in the second package substrate. In this case, stress due to a deflection of a target of detection is further efficiently exerted on the first piezoelectric plate. Therefore, detection efficiency of a deflection by the piezoelectric deflection sensor is further improved.

A detection device according to a preferred embodiment of the present invention includes a sensor circuit including an operational amplifier including first and second input ends and an output end; and the piezoelectric deflection sensor according to a preferred embodiment of the present invention, wherein the piezoelectric deflection sensor is connected to the first input end of the operational amplifier. In this case, since the piezoelectric deflection sensor that has a large capacitance is used, a signal in a further lower frequency band is able to be detected.

With piezoelectric deflection sensors and detection devices according to preferred embodiments of the present invention, detection efficiency of a deflection of substrates onto which the piezoelectric deflection sensors and the detection devices are fixed are improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, the present invention will be clarified by describing specific preferred embodiments of the present invention with reference to the drawings.

It is pointed out that preferred embodiments disclosed in the present specification are exemplary and partial substitutions or combinations between different preferred embodiments may occur.

Figure 1:
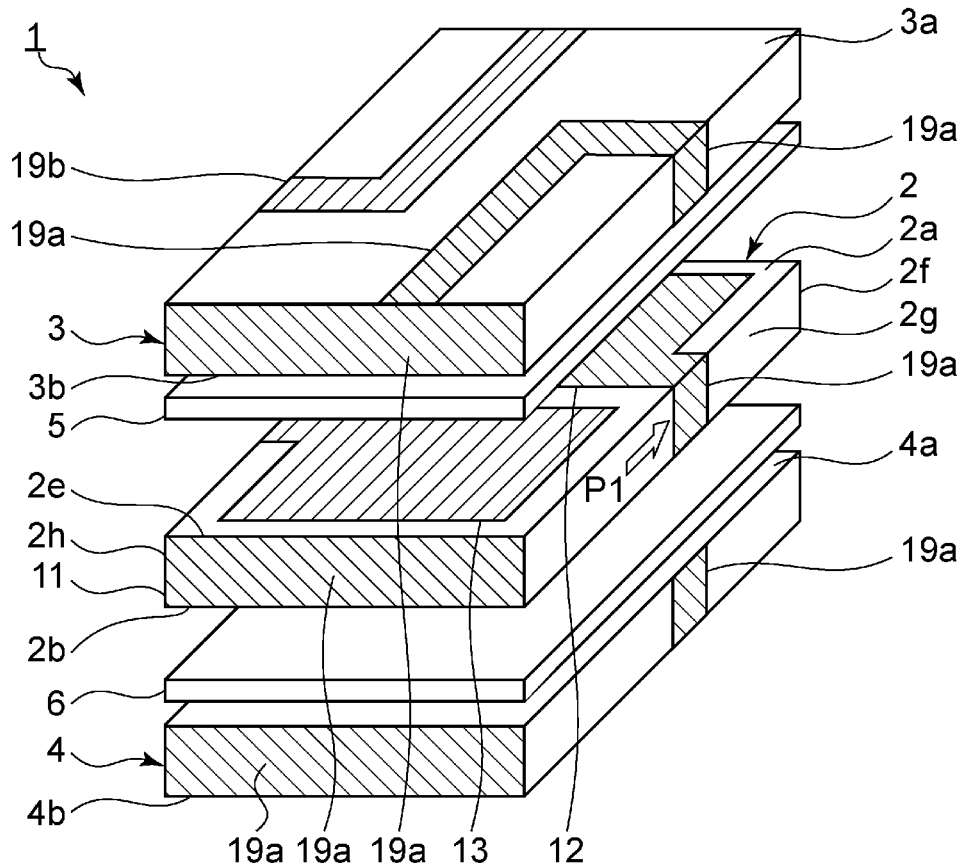
FIG. 1 is an exploded perspective view of a piezoelectric deflection sensor according to a first preferred embodiment of the present invention.
Figure 2:
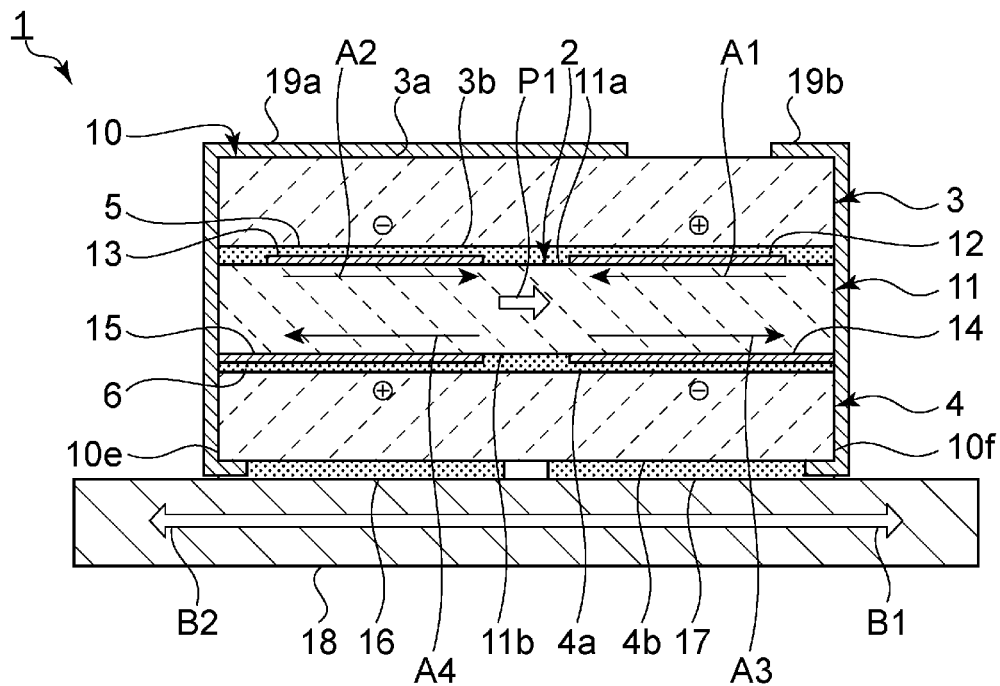
FIG. 2 is a schematic elevation cross-sectional view showing a state in which the piezoelectric deflection sensor according to the first preferred embodiment of the present invention is provided on a substrate which is a target of detection of its deflection.

FIG. 1 is an exploded perspective view of a piezoelectric deflection sensor according to a first preferred embodiment of the present invention. FIG. 2 is a schematic elevation cross-sectional view showing a state in which the piezoelectric deflection sensor according to the first preferred embodiment is provided on a substrate which is a target of detection of its deflection.

As shown in FIG. 1, a piezoelectric deflection sensor 1 includes a piezoelectric element 2, first and second package substrates 3 and 4, and first and second bonding material layers 5 and 6. The piezoelectric element 2 includes first and second principal surfaces 2a and 2b opposing each other, first and second lateral surfaces 2g and 2h opposing each other, and first and second end surfaces 2e and 2f opposing each other.

The piezoelectric element 2 includes a first piezoelectric plate 11 having a rectangular or substantially rectangular plan shape. The first piezoelectric plate 11 is preferably made of piezoelectric ceramics, such as PZT or a piezoelectric single crystal, for example. The plan shape of the first piezoelectric plate 11 may also be square or substantially square.

As shown in FIG. 2, the first piezoelectric plate 11 includes first and second principal surfaces 11a and 11b opposing each other. A polarization axis direction P1 of the first piezoelectric plate 11 is along a lengthwise direction of the first piezoelectric plate 11. That is, the polarization axis direction P1 is parallel or substantially parallel to the first principal surface 11a and the second principal surface 11b and in a direction along the sides extending in the lengthwise direction of the rectangular or substantially rectangular plan shape. The polarization axis direction P1 of the first piezoelectric plate 11 is not limited to this. The polarization axis direction P1 is sufficient to be a direction along any side of the rectangular or substantially rectangular plan shape or the square or substantially square plan shape of the first piezoelectric plate 11.

In the present preferred embodiment, the first principal surface 11a of the first piezoelectric plate 11 is the first principal surface 2a of the piezoelectric element 2 shown in FIG. 1. The second principal surface 11b of the first piezoelectric plate 11 is the second principal surface 2b of the piezoelectric element 2.

The piezoelectric deflection sensor 1 is provided on a substrate 18 from the second package substrate 4 side. Accordingly, the package substrate located below the first piezoelectric plate defines the second package substrate 4, and in the first piezoelectric plate 11, the principal surface on the side on which the first piezoelectric plate 11 is stacked on the second package substrate 4, that is, the lower surface is the second principal surface 11b.

Figure 3A:
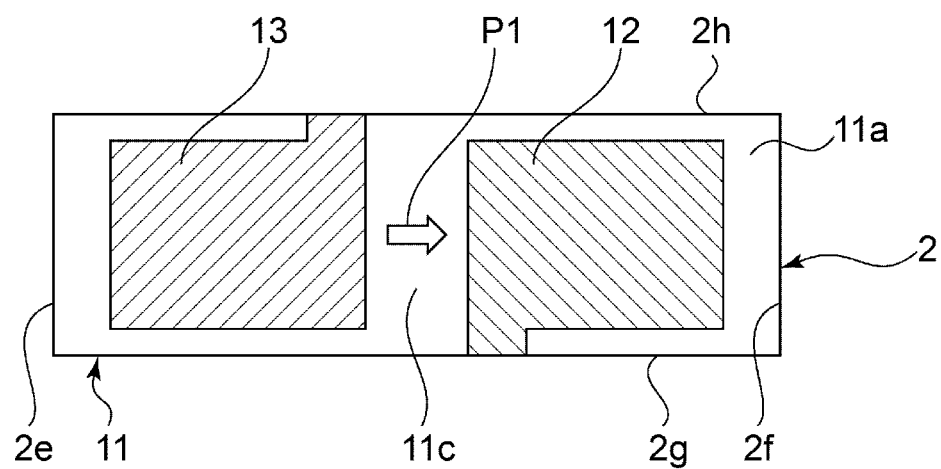
FIG. 3A is a schematic plan view of a first piezoelectric plate in the first preferred embodiment of the present invention.
Figure 3B:
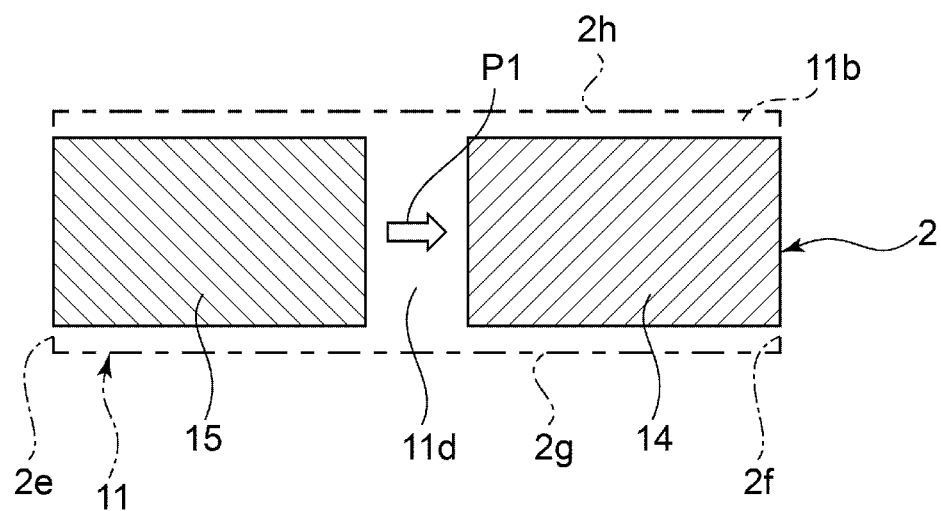
FIG. 3B is a schematic plan view of the first piezoelectric plate which is made translucent.

FIG. 3A is a schematic plan view of the first piezoelectric plate in the first preferred embodiment. FIG. 3B is a schematic plan view of the first piezoelectric plate which is made translucent.

As shown in FIG. 3A, first and second segmented electrodes 12 and 13 are provided on the first principal surface 11a of the first piezoelectric plate 11. The first segmented electrode 12 and the second segmented electrode 13 are provided along the polarization axis direction P1 across a first electrode non-formation region 11c. The first electrode non-formation region 11c means a region which is on the first principal surface 11a and is interposed between the first segmented electrode 12 and the second segmented electrode 13. The first electrode non-formation region 11c extends in a direction intersecting the polarization axis direction P1, and in the present preferred embodiment, preferably a direction perpendicular or substantially perpendicular to the polarization axis direction P1.

As shown in FIG. 3B, third and fourth segmented electrodes 14 and 15 are provided on the second principal surface 11b. The third segmented electrode 14 and the fourth segmented electrode 15 are provided along the polarization axis direction P1 across a second electrode non-formation region 11d. The second electrode non-formation region 11d extends in a direction intersecting the polarization axis direction P1, and in the present preferred embodiment, preferably the direction perpendicular to the polarization axis direction P1. The first and second segmented electrodes 12 and 13 and the third and fourth segmented electrodes 14 and 15 are preferably made of metal such as Cu, Ag, Al or Au or alloy, for example.

The first segmented electrode 12 and the third segmented electrode 14 oppose each other across the first piezoelectric plate 11. The second segmented electrode 13 and the fourth segmented electrode 15 oppose each other across the first piezoelectric plate 11.

Returning to FIG. 1, the first package substrate 3 includes first and second principal surfaces 3a and 3b opposing each other. The second package substrate 4 also includes first and second principal surfaces 4a and 4b opposing each other. Although the plan shapes of the first and second package substrates 3 and 4 are not particularly limited, in the present preferred embodiment, they are preferably the same or substantially the same as the plan shape of the first piezoelectric plate 11. The first and second package substrates 3 and 4 are preferably made of an insulative ceramics, such as alumina, for example. Nevertheless, they may be made of semiconductor ceramics, piezoelectric ceramics or suitable materials other than the insulative ceramics.

The first package substrate 3 is bonded onto the first principal surface 2a of the piezoelectric element 2 with the first bonding material layer 5. More specifically, the second principal surface 3b of the first package substrate 3 and the first principal surface 2a of the piezoelectric element 2 are bonded together. The second package substrate 4 is bonded onto the second principal surface 2b of the piezoelectric element 2 with the second bonding material layer 6. More specifically, the first principal surface 4a of the second package substrate 4 and the second principal surface 2b of the piezoelectric element 2 are bonded together. The first and second bonding material layers 5 and 6 are preferably made of adhesive agents, such as an epoxy-based adhesive agent, for example. The adhesive agents are not specifically limited.

First and second external electrodes 19a and 19b are provided on a stacked body including the piezoelectric element 2 and the first and second package substrates 3 and 4. The first segmented electrode 12 and the fourth segmented electrode 15 are electrically connected to each other via the first external electrode 19a. The second segmented electrode 13 and the third segmented electrode 14 are electrically connected to each other via the second external electrode 19b.

In the present preferred embodiment, the first segmented electrode 12 and the fourth segmented electrode 15 which opposes the second segmented electrode 13 separated from the first segmented electrode 12 in the polarization axis direction P1 are electrically connected to each other; and the second segmented electrode 13 and the third segmented electrode 14 opposing the first segmented electrode 12 are electrically connected to each other. Thus, a deflection is able to be detected by the piezoelectric deflection sensor 1 with high detection efficiency. This will be described below along with specific configurations of the first and second external electrodes 19a and 19b.

Figure 4A:
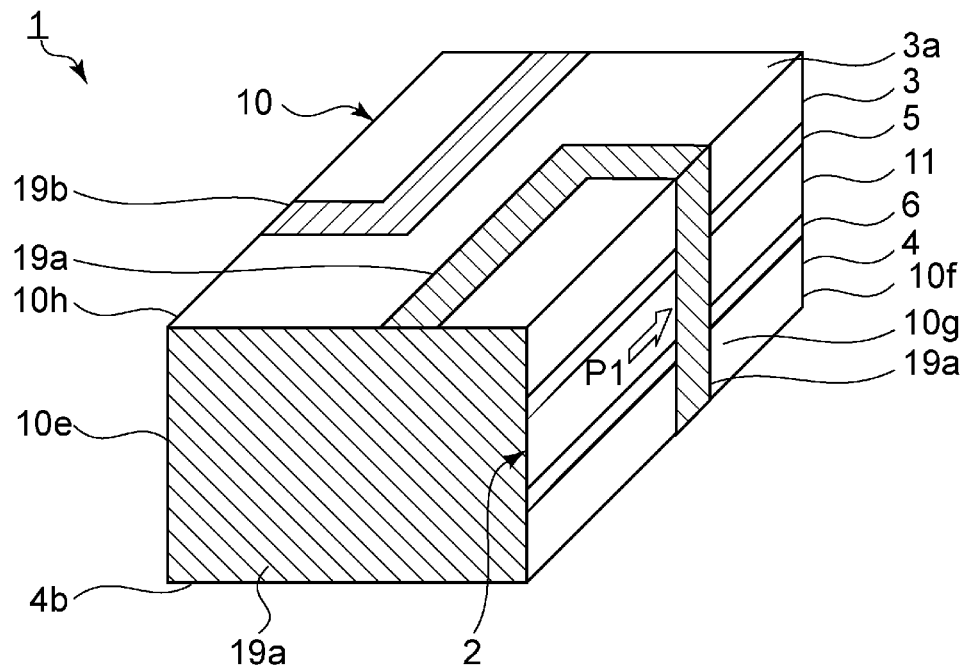
FIGS. 4A and 4B are perspective views of the piezoelectric deflection sensor according to the first preferred embodiment of the present invention.
Figure 4B:
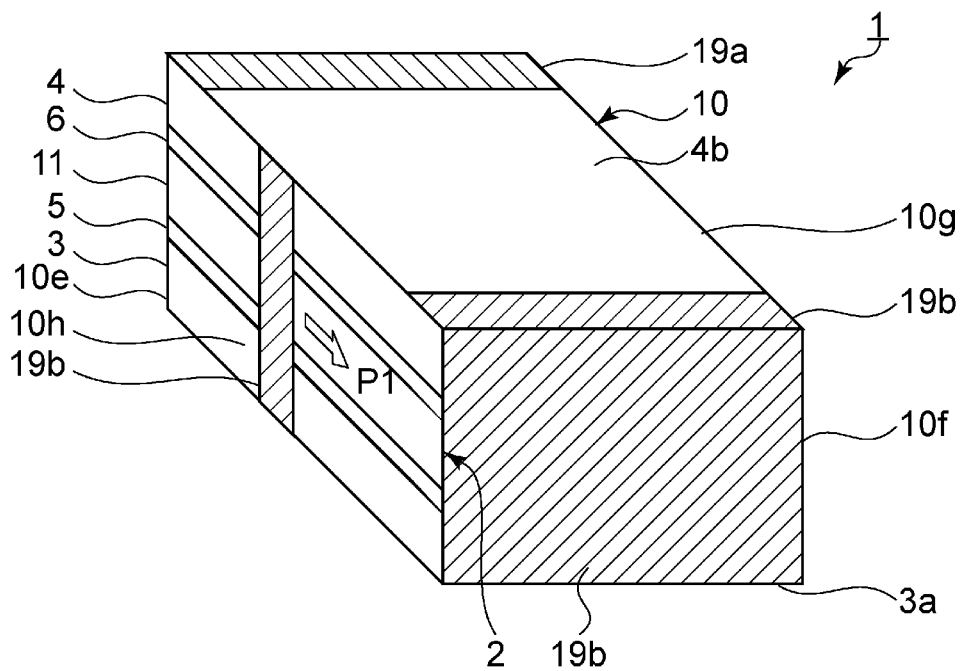

FIGS. 4A and 4B are perspective views of the piezoelectric deflection sensor according to the first preferred embodiment.

As shown in FIG. 4A, the piezoelectric deflection sensor 1 includes a stacked body 10 including the first piezoelectric plate 11 and the first and second package substrates 3 and 4 that are stacked. The stacked body 10 includes first and second end surfaces 10e and 10f opposing each other in the lengthwise direction. The direction perpendicular or substantially perpendicular to the lengthwise direction and the thickness direction is denoted as a widthwise direction. Here, the stacked body 10 includes first and second lateral surfaces 10g and 10h opposing each other in the widthwise direction.

The first external electrode 19a covers the first end surface 10e. The first external electrode 19a is also provided on the first lateral surface 10g continuously in the thickness direction. More specifically, the first external electrode 19a is continuously provided on portions of the piezoelectric element 2 and the first and second package substrates 3 and 4 which define the first lateral surface 10g of the stacked body 10. The first external electrode 19a is provided on the first principal surface 3a of the first package substrate 3 so as to connect the first external electrodes 19a provided on the first end surface 10e and the first lateral surface 10g of the stacked body 10.

As shown in FIG. 1, the first segmented electrode 12 extends onto the first lateral surface 10g of the stacked body 10 shown in FIG. 4A. Thus, the first segmented electrode 12 is connected to the first external electrode 19a. As shown in FIG. 2, the fourth segmented electrode 15 is also connected to the first external electrode 19a provided on the first end surface 10e. As described above, the first segmented electrode 12 and the fourth segmented electrode 15 are connected to each other via the first external electrode 19a.

Further, as shown in FIG. 4B, the second external electrode 19b is provided on the second end surface 10f and the second lateral surface 10h of the stacked body 10 and the second principal surface 4b of the second package substrate 4. Via the second external electrode 19b, the second segmented electrode 13 and the third segmented electrode 14 shown in FIG. 2 are electrically connected to each other.

The first and second external electrodes 19a and 19b are provided on the second principal surface 4b of the second package substrate 4 such that they are respectively continuous to the first and second external electrodes 19a and 19b that are provided on the first and second end surfaces 10e and 10f of the stacked body 10. Electrode patterns of the first and second external electrodes 19a and 19b are not limited to those described above.

Deflection detection operation of the piezoelectric deflection sensor 1 is described with reference to FIG. 2.

The piezoelectric deflection sensor 1 is provided on the substrate 18 as a target of detection of its deflection from the second package substrate 4 side in a face-to-face manner. More specifically, the piezoelectric deflection sensor 1 is provided on the substrate 18 in a face-to-face manner via bonding material layers 16 and 17. As the bonding material layers 16 and 17, suitable bonding materials, such as an adhesive agent and solder, for example, may preferably be used.

It is assumed that the substrate 18 is deflected as indicated by arrows B1 and B2. In this case, the substrate 18 expands in the direction indicated by the arrow B1 on one lengthwise end side. The substrate 18 expands as indicated by the arrow B2 on the other lengthwise end side. When such a deflection occurs, stress due to the deflection is exerted on the first piezoelectric plate 11 via the second package substrate 4. At this stage, a portion of the second package substrate 4 that is above a portion of the substrate 18 extending in the direction indicated by the arrow B1 expands in the same direction.

The portion of the second package substrate 4 expanding in the direction indicated by the arrow B1 includes a region in which the first segmented electrode 12 and the third segmented electrode 14 oppose each other in plan view. Accordingly, a portion in which the third segmented electrode 14 is provided on the second principal surface 11b of the first piezoelectric plate 11 expands in the direction indicated by an arrow A3.

During the occurrence of the deflection, a portion in which the first segmented electrode 12 is provided on the first principal surface 11a of the first piezoelectric plate 11 shrinks in the reverse direction to that of the arrow A3, that is, in the direction indicated by an arrow A1.

In a region in which the second segmented electrode 13 and the fourth segmented electrode 15 oppose each other in plan view, the substrate 18 expands in the direction indicated by the arrow B2. Accordingly, a portion in which the fourth segmented electrode 15 is provided on the second principal surface 11b of the first piezoelectric plate 11 expands in the direction indicated by an arrow A4 that is the same as the direction of the arrow B2. A portion in which the second segmented electrode 13 is provided on the first principal surface 11a shrinks in the direction indicated by an arrow A2 which is the reverse direction to that of the arrow A4.

Accordingly, in the first piezoelectric plate 11, stresses in opposite directions are generated in the region in which the first and third segmented electrodes 12 and 14 oppose each other and in the region in which the second and fourth segmented electrodes 13 and 15 oppose each other. Therefore, a positive charge is generated in the portion in which the first segmented electrode 12 is provided, and a negative charge is generated in the portion in which the second segmented electrode 13 is provided, on the first piezoelectric plate 11. A negative charge is generated in the portion in which the third segmented electrode 14 is provided, and a positive charge is generated in the portion in which the fourth segmented electrode 15 is provided, on the first piezoelectric plate 11.

Here, the first segmented electrode 12 and the fourth segmented electrode 15 are electrically connected to each other with the first external electrode 19a, and the second segmented electrode 13 and the third segmented electrode 14 are electrically connected to each other with the second external electrode 19b. Therefore, a potential according to the deflection of the substrate 18 is able to be output from the first external electrode 19a and the second external electrode 19b.

In the present preferred embodiment, an opposite portion to the first and third segmented electrodes 12 and 14 and an opposite portion to the second and fourth segmented electrodes 13 and 15 are connected to each other in parallel. Therefore, a capacitance is effectively made large, and charge sensitivity of the piezoelectric deflection sensor 1 is effectively improved. Accordingly, detection efficiency of a deflection of the substrate 18 by the piezoelectric deflection sensor 1 is effectively improved.

In addition, since the deflection is able to be detected with outputs of the first to fourth segmented electrodes 12 to 15, a complex correction circuit is not required. In addition, since the capacitance is large, when the piezoelectric deflection sensor 1 is connected to a circuit, it is unlikely to be adversely affected by the influence of noise from the circuit.

In the present preferred embodiment, since the first and second package substrates 3 and 4 are included, the strength of the piezoelectric deflection sensor 1 is improved. It is preferable that the elastic moduli of the first and second package substrates 3 and 4 are higher than the elastic modulus of the first piezoelectric plate 11. Thus, the strength of the piezoelectric deflection sensor 1 is further improved.

As shown in FIG. 3A, the first segmented electrode 12 extends onto the first lateral surface 2g of the piezoelectric element 2. As shown in FIG. 4A, it is connected to the first external electrode 19a and covered by the same. The portion of the first segmented electrode 12 other than the extended portion of the same does not extend to the first or second lateral surface 2g or 2h. Therefore, the first segmented electrode 12 is not exposed from the first or second lateral surface 2g or 2h of the piezoelectric element 2. Similarly, the second segmented electrode 13 is also not exposed from the first or second lateral surface 2g or 2h of the piezoelectric element 2. Furthermore, the third and fourth segmented electrodes 14 and 15 shown in FIG. 3B are also not exposed from the first or second lateral surface 2g or 2h. Thus, impurities are unlikely to adhere to any of the first to fourth segmented electrodes 12 to 15. Accordingly, an insulation resistance is not likely to decrease.

Similarly, the first to fourth segmented electrodes 12 to 15 are not exposed from the first or second end surface 2e or 2f. Therefore, the insulation resistance is even less likely to decrease.

The electrode patterns of the first and second external electrodes 19a and 19b and modes of connections of these to the outside are not specially limited. Hereafter, examples of the connections of the first and second external electrodes 19a and 19b to the outside are described.

Figure 5:
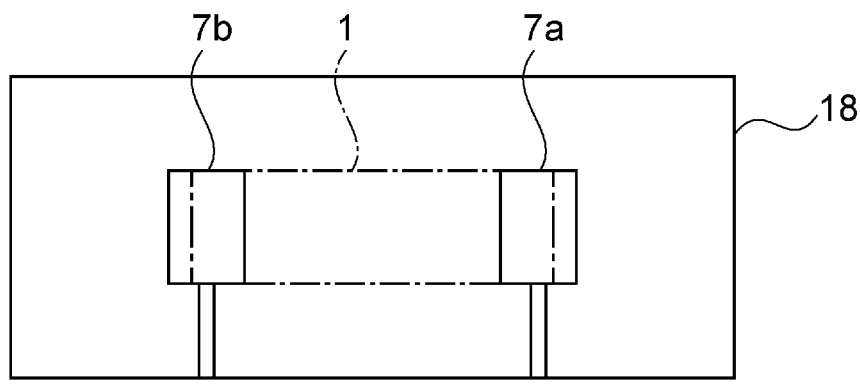
FIG. 5 is a schematic plan view exemplarily showing an electrode structure of the substrate which is a target of detection of its deflection.

For example, as shown in FIG. 5, electrode lands connected to the outside may be configured on the substrate 18 which is a target of detection.

FIG. 5 is a schematic plan view exemplarily showing an electrode structure of the substrate which is a target of detection of its deflection.

First and second electrode lands 7a and 7b are provided on the substrate 18. The first and second electrode lands 7a and 7b are individually connected to the outside. The piezoelectric deflection sensor 1 is fixed at the position indicated by long dashed short dashed lines. When the piezoelectric deflection sensor 1 is fixed onto the substrate 18, the first external electrode 19a shown in FIG. 2 is connected to the first electrode land 7a. The second external electrode 19b is connected to the second electrode land 7b.

For example, when solder, a conductive adhesive material or other suitable bonding material, for example, is used for the bonding material layers 16 and 17 shown in FIG. 2, the first and second external electrodes 19a and 19b and the first and second electrode lands 7a and 7b are electrically connected to each other with the bonding material layers 16 and 17, respectively.

Figure 6:
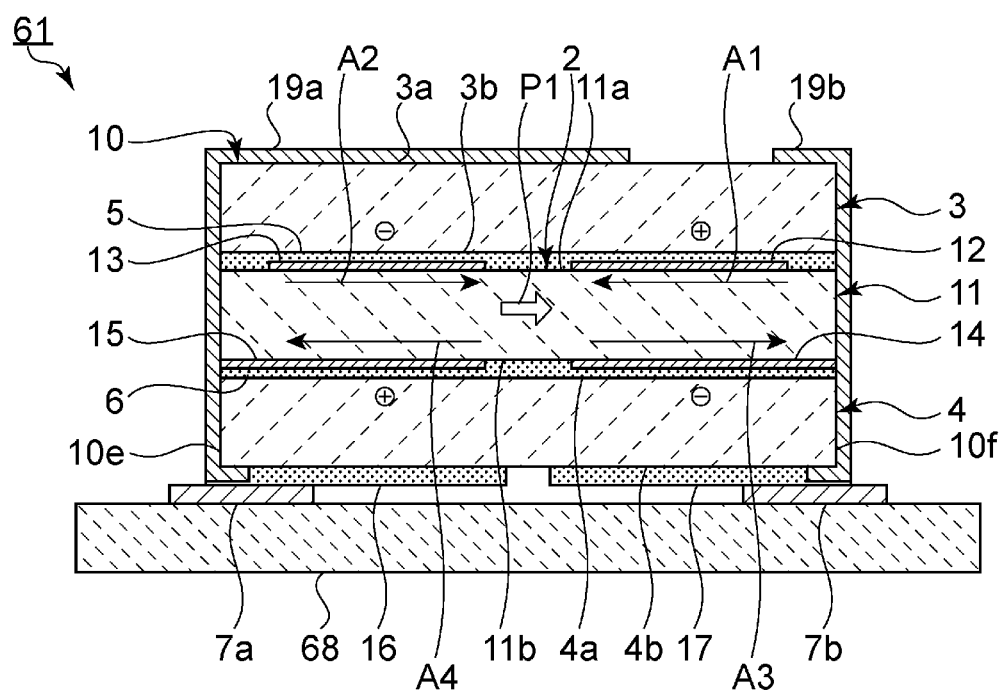
FIG. 6 is a schematic elevation cross-sectional view of a piezoelectric deflection sensor according to a first modification of the first preferred embodiment of the present invention.

Alternatively, the first and second electrode lands 7a and 7b may not be provided on the substrate 18 which is a target of detection. For example, as in a first modification of the first preferred embodiment shown in FIG. 6, the stacked body 10 may be provided on a substrate 68 including the first and second electrode lands 7a and 7b. The material of the substrate 68 is not specifically limited, but a glass epoxy substrate, for example, is preferably used.

In this case, the stacked body 10 is fixed to the target of detection via the substrate 68. The substrate 68 is preferably larger in a lengthwise dimension and a widthwise dimension than the stacked body 10 in plan view. Therefore, since the substrate 68 is easily deflected, the first piezoelectric plate 11 is able to be easily deformed. Accordingly, detection efficiency of a deflection by the piezoelectric deflection sensor 61 is effectively improved.

Also in second to seventh modifications of the first preferred embodiment described below, detection efficiency of a deflection by a piezoelectric deflection sensor is improved similarly to the first preferred embodiment.

Figure 7A:
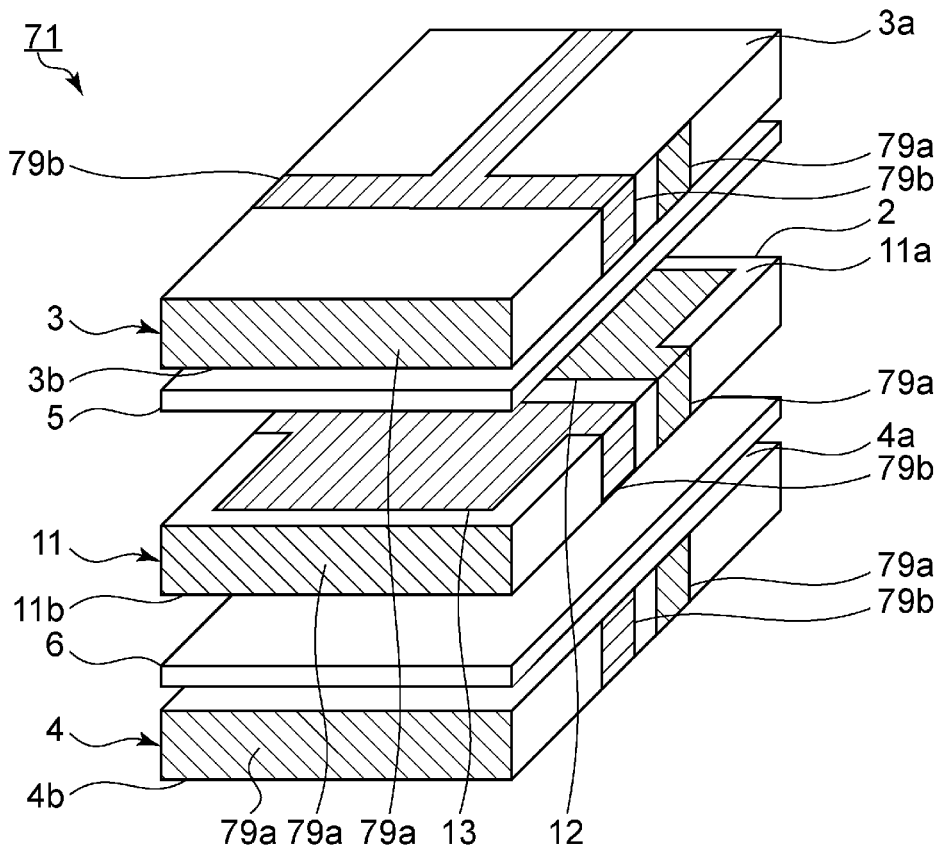
FIGS. 7A and 7B are exploded perspective views of a piezoelectric deflection sensor according to a second modification of the first preferred embodiment of the present invention.
Figure 7B:
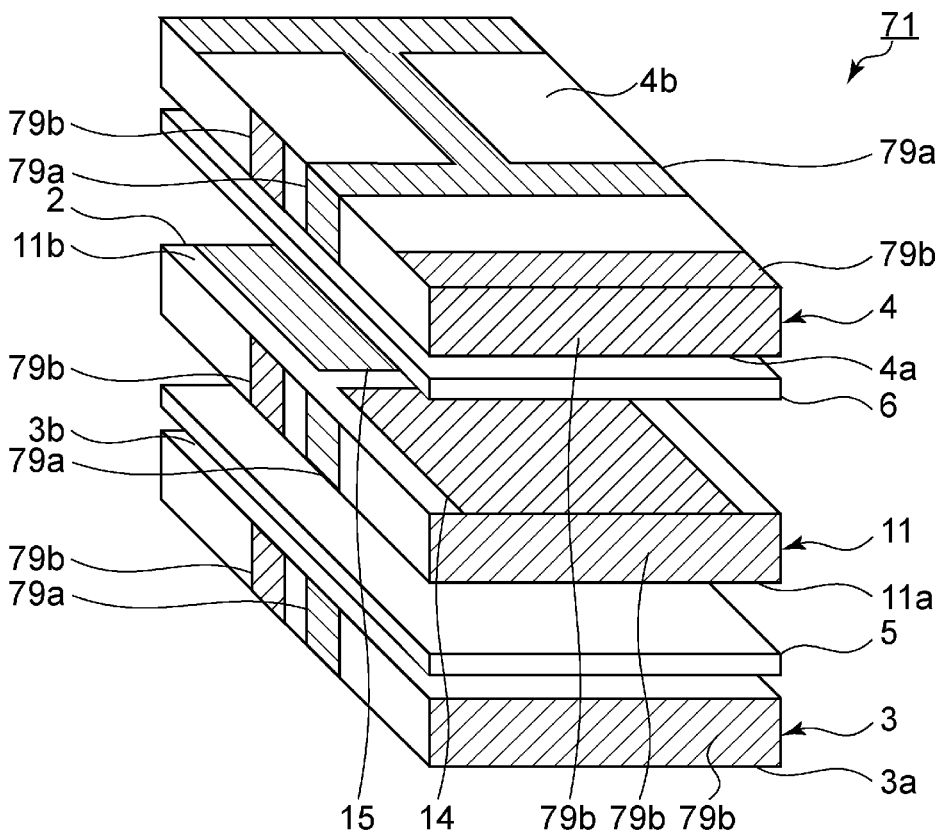

The first and second external electrodes may be patterned, for example, as in a second modification of the first preferred embodiment shown below. More specifically, in a piezoelectric deflection sensor 71 shown in FIGS. 7A and 7B, both of the first and second external electrodes 79a and 79b may preferably be provided on both of the first and second lateral surfaces of the stacked body. The first segmented electrode 12 is extended onto both of the first and second lateral surfaces, and connected to the first external electrode 79a on the first and second lateral surfaces. Similarly, the second segmented electrode 13 is connected to the second external electrode 79b on the first and second lateral surfaces.

The first external electrode 79a is also provided on the first end surface of the stacked body. The first external electrode 79a that is provided on the first and second lateral surfaces and the first end surface is connected with the first external electrode 79a that is provided on the second principal surface 4b of the second package substrate 4. Meanwhile, the second external electrode 79b is also provided on the second end surface of the stacked body. The second external electrode 79b that is provided on the first and second lateral surfaces and the second end surface is connected with the second external electrode 79b that is provided on the first principal surface 3a of the first package substrate 3.

Each first external electrode or each second external electrode may not necessarily be connected in the stacked body. For example, a piezoelectric deflection sensor according to a third modification of the first preferred embodiment includes a substrate 88 shown in FIG. 8. The substrate 88 may include a connection wire 87c connecting the first external electrodes to each other. In this case, as shown in FIGS. 9A and 9B, first and second external electrodes 89a and 89b may preferably be provided.

More specifically, the first external electrode 89a is provided on the first and second end surfaces of the stacked body and is not provided on the first or second lateral surface thereof. The first and fourth segmented electrodes 12 and 15 are extended onto the first and second end surfaces, respectively, and connected to the first external electrode 89a. The first external electrode 89a is also provided on the second principal surface 4b of the second package substrate 4 so as to be continuous with the first external electrode 89a provided on the first and second end surfaces.

Figure 8:
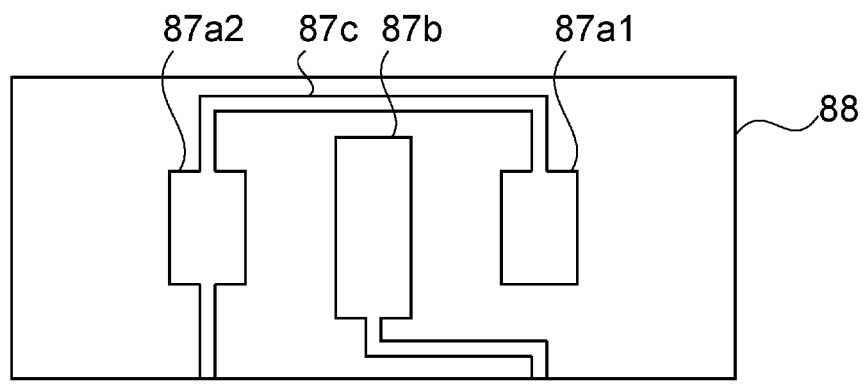
FIG. 8 is a schematic plan view showing an electrode structure of a substrate in a third modification of the first preferred embodiment of the present invention.
Figure 9A:
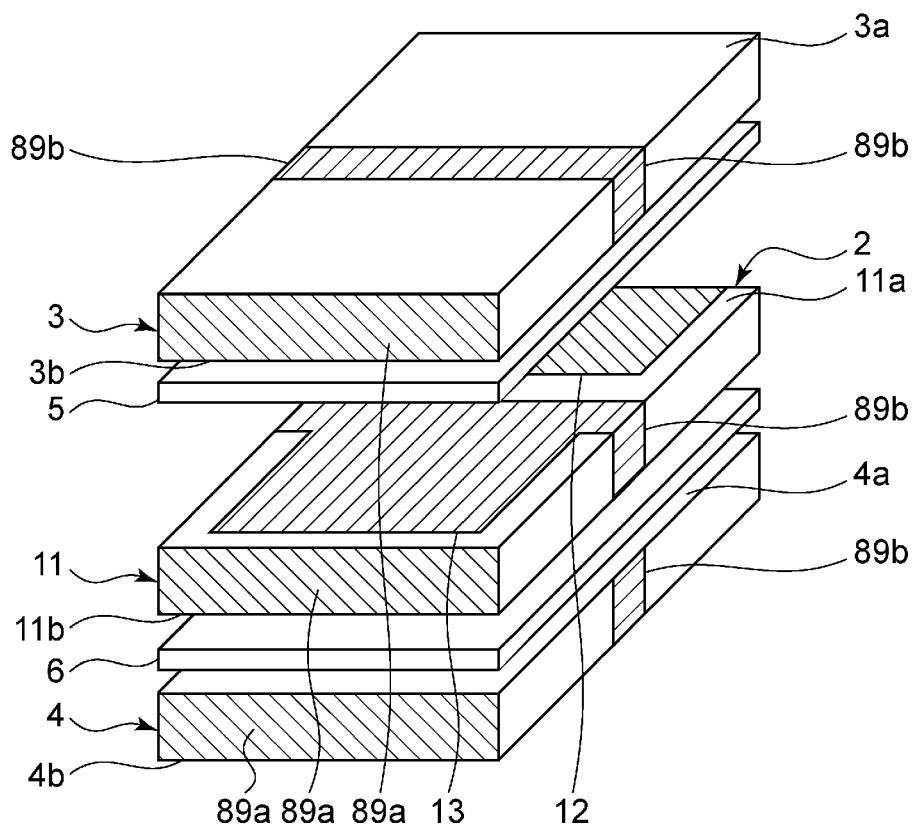
FIGS. 9A and 9B are exploded perspective views of a stacked body in the third modification of the first preferred embodiment of the present invention.
Figure 9B:
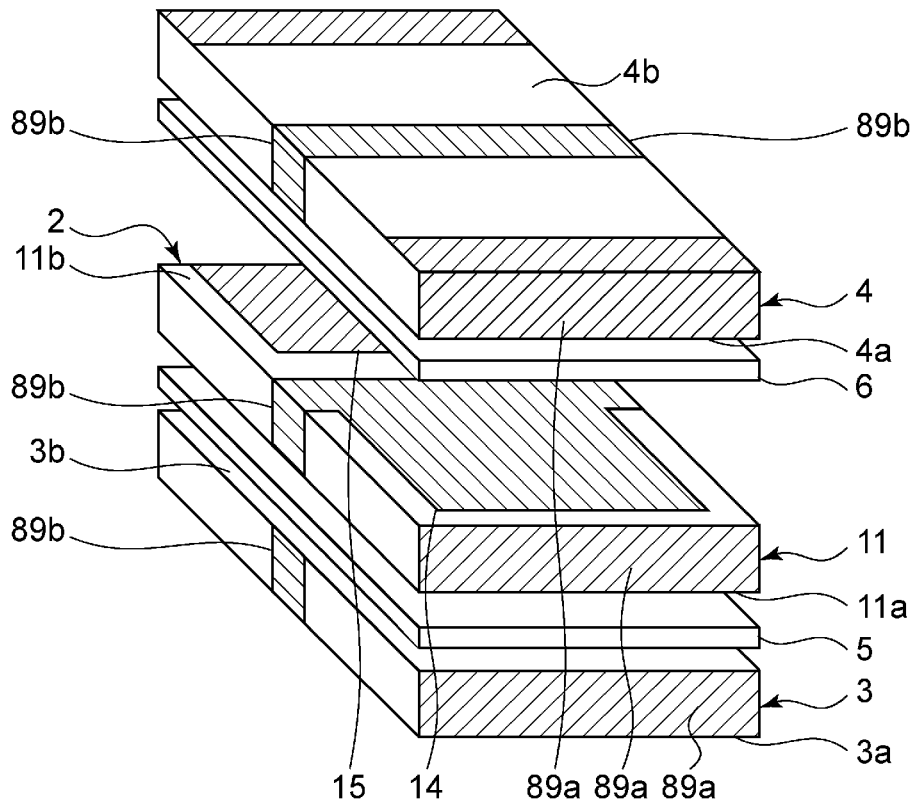

The stacked body is provided on the substrate 88 shown in FIG. 8 from the second package substrate 4 side. The first external electrodes 89a provided on the second principal surface 4b of the second package substrate 4 are connected to first electrode lands 87a1 and 87a2, respectively. The first electrode lands 87a1 and 87a2 are connected to each other with the connection wire 87c. Therefore, the first external electrodes 89a are connected to each other with the connection wire 87c.

The second external electrode 89b is provided on the first and second lateral surfaces of the stacked body. The second external electrodes 89b are also provided on the first principal surface 3a of the first package substrate 3 and on the second principal surface 4b of the second package substrate 4 so as to connect the second external electrodes 89b that are provided on the first and second lateral surfaces to each other. The second external electrode 89b is connected to a second electrode land 87b of the substrate 88 shown in FIG. 8.

Figure 10:
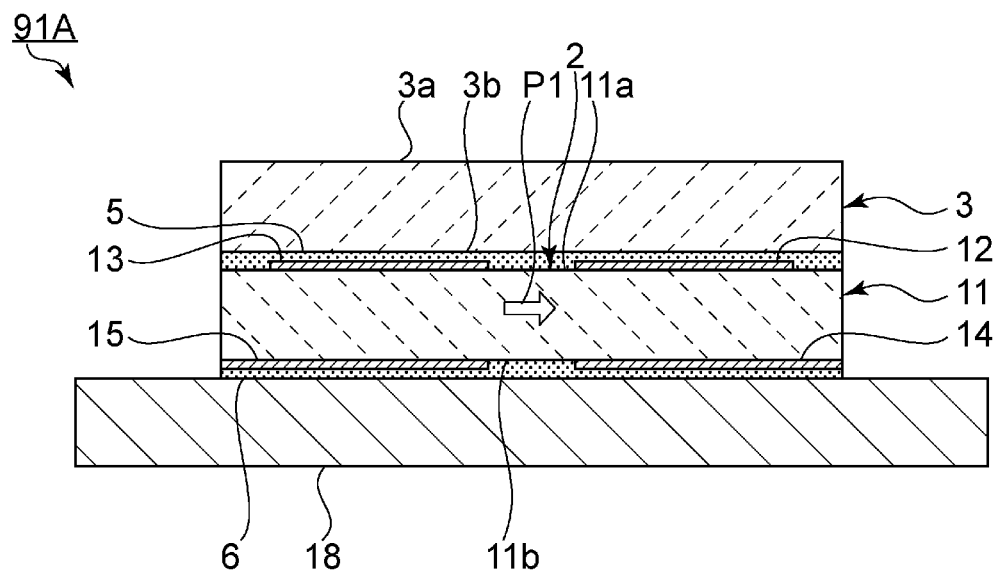
FIG. 10 is a schematic elevation cross-sectional view showing a state in which a piezoelectric deflection sensor according to a fourth modification of the first preferred embodiment of the present invention is provided on a substrate which is a target of detection of its deflection.
Figure 11:
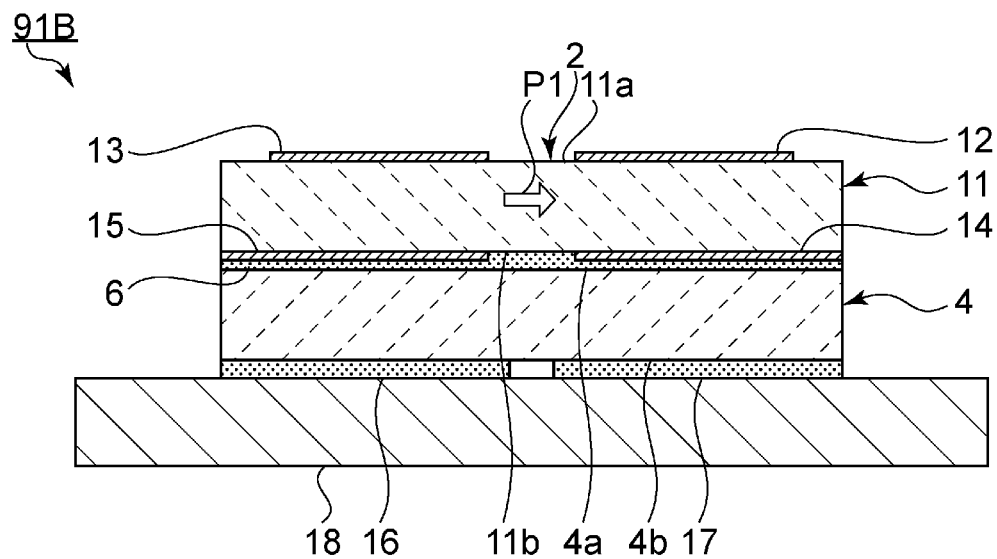
FIG. 11 is a schematic elevation cross-sectional view showing a state in which a piezoelectric deflection sensor according to a fifth modification of the first preferred embodiment of the present invention is provided on a substrate which is a target of detection of its deflection.
Figure 12:
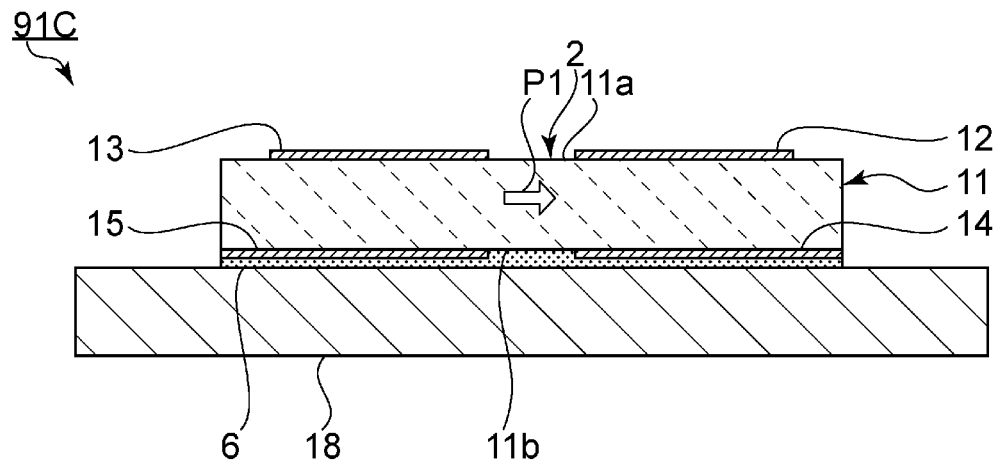
FIG. 12 is a schematic elevation cross-sectional view showing a state in which a piezoelectric deflection sensor according to a sixth modification of the first preferred embodiment of the present invention is provided on a substrate which is a target of detection of its deflection.

While in the first preferred embodiment, the first and second package substrates 3 and 4 are included as shown in FIG. 2, the first preferred embodiment is not limited to this and, for example, configurations shown in FIG. 10 to FIG. 12 below are possible. In FIG. 10 to FIG. 12, the first and second external electrodes are omitted.

As in a piezoelectric deflection sensor 91A according to a fourth modification of the first preferred embodiment shown in FIG. 10, the second package substrate may not be provided but the first package substrate 3 may be provided. Alternatively, as in a piezoelectric deflection sensor 91B according to a fifth modification of the first preferred embodiment shown in FIG. 11, the first package substrate may not be provided but the second package substrate 4 may be provided. In the fourth and fifth modifications, the heights of the piezoelectric deflection sensors 91A and 91B are able to be made small. Furthermore, since the number of components used is reduced, productivity is improved.

As in a piezoelectric deflection sensor 91C according to a sixth modification of the first preferred embodiment shown in FIG. 12, the first and second package substrates may not be provided. In this case, the height of the piezoelectric deflection sensor 91C is able to be made even small, and productivity is improved. Nevertheless, as in the first preferred embodiment shown in FIG. 2, it is preferable to include the first and second package substrates 3 and 4. Thus, the strength of the piezoelectric deflection sensor 1 is effectively improved.

Figure 13:
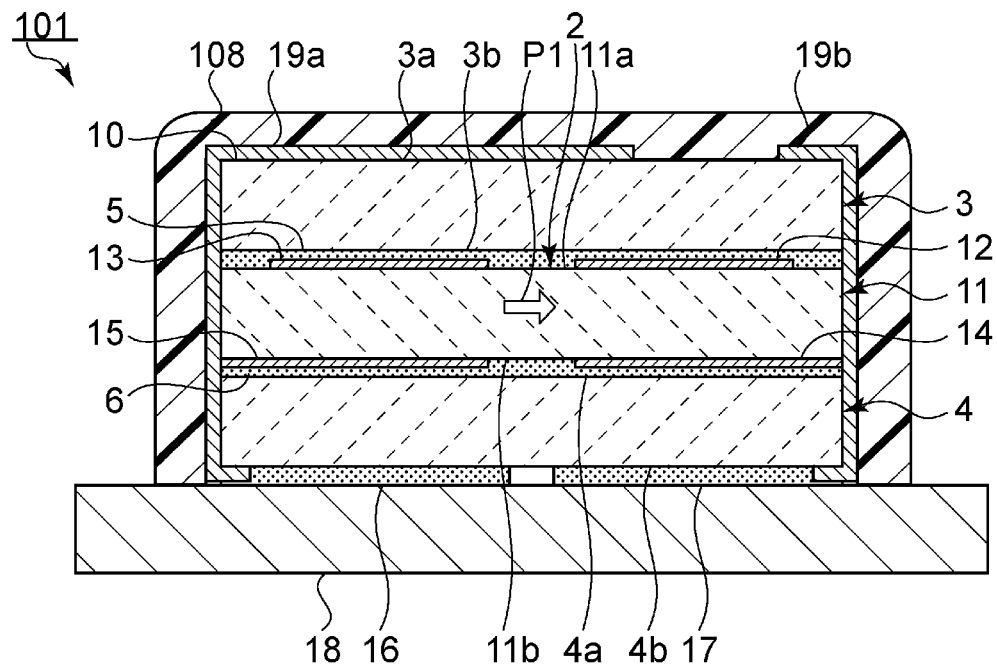
FIG. 13 is a schematic elevation cross-sectional view showing a state in which a piezoelectric deflection sensor according to a seventh modification of the first preferred embodiment of the present invention is provided on a substrate which is a target of detection of its deflection.

As in a seventh modification of the first preferred embodiment shown in FIG. 13, the stacked body 10 other than the surface thereof which is fixed to the substrate 18 may be covered by a resin layer 108. Thus, the strength of the piezoelectric deflection sensor 101 is further improved. In addition, the piezoelectric deflection sensor 101 is unlikely to be adversely affected by the influence of an external environment. Also in the cases in which one of the first and second package substrates 3 and 4 is not included, for example, as shown in FIG. 10 and FIG. 11, the resin layer 108 may be provided. Also in the case in which neither the first package substrate 3 nor the second package substrate 4 is included as shown in FIG. 12, the resin layer 108 may be provided.

Figure 14:
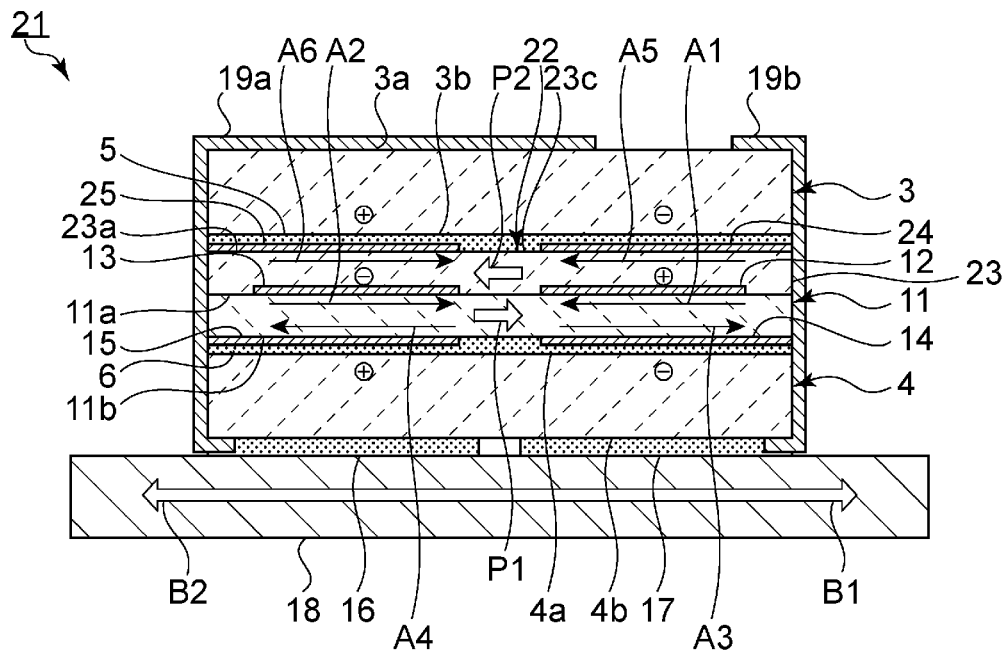
FIG. 14 is a schematic elevation cross-sectional view showing a state in which a piezoelectric deflection sensor according to a second preferred embodiment of the present invention is provided on a substrate which is a target of detection of its deflection.

FIG. 14 is a schematic elevation cross-sectional view showing a state in which a piezoelectric deflection sensor according to a second preferred embodiment of the present invention is provided on a substrate which is a target of detection of its deflection.

A piezoelectric deflection sensor 21 is different from that according to the first preferred embodiment in that a piezoelectric element 22 includes a second piezoelectric plate 23 stacked on the first piezoelectric plate 11. Other than this difference, the piezoelectric deflection sensor 21 has a similar configuration to that of the piezoelectric deflection sensor 1 according to the first preferred embodiment.

More specifically, the second piezoelectric plate 23 is stacked on the first principal surface 11a side of the first piezoelectric plate 11. Alternatively, the second piezoelectric plate 23 may be stacked on the second principal surface 11b side of the first piezoelectric plate 11.

A polarization axis direction P2 of the second piezoelectric plate 23 is the reverse direction to the polarization axis direction P1 of the first piezoelectric plate 11. Fifth and sixth segmented electrodes 24 and 25 are provided on a principal surface 23a of the second piezoelectric plate 23 on the opposite side to the first piezoelectric plate 11 side. The fifth and sixth segmented electrodes 24 and 25 are provided along the polarization axis direction P2 across a third electrode non-formation region 23c. The third electrode non-formation region 23c extends in a direction intersecting the polarization axis direction P2, and in the present preferred embodiment, preferably in a direction perpendicular or substantially perpendicular to the polarization axis direction P2.

The fifth segmented electrode 24 is provided so as to oppose the first and third segmented electrodes 12 and 14 in the thickness direction. The sixth segmented electrode 25 is provided so as to oppose the second and fourth segmented electrodes 13 and 15 in the thickness direction.

A portion of the second piezoelectric plate 23 in which the fifth segmented electrode 24 is provided shrinks in the direction indicated by an arrow A5 which is the reverse direction to that of the arrow A3, when a deflection arises on the substrate 18 which is a target of detection. Therefore, a negative charge is generated in the portion of the second piezoelectric plate 23 in which the fifth segmented electrode 24 is provided. The fifth segmented electrode 24 is connected to the second external electrode 19b similarly to the third segmented electrode 14.

A portion of the second piezoelectric plate 23 in which the sixth segmented electrode 25 is provided shrinks in the direction indicated by an arrow A6 which is the reverse direction to that of the arrow A4. Therefore, a positive charge is generated in the portion of the second piezoelectric plate 23 in which the sixth segmented electrode 25 is provided. The sixth segmented electrode 25 is connected to the first external electrode 19a similarly to the fourth segmented electrode 15.

Also in the present preferred embodiment, detection efficiency of a deflection by the piezoelectric deflection sensor 21 is improved. Furthermore, since the piezoelectric element 22 has the stacking structure as described above, a capacitance is able to be made even larger, which further improves charge sensitivity of the piezoelectric deflection sensor 21.

While in the second preferred embodiment, a case is described in which the piezoelectric element is preferably a double layered stacked body including the first and second piezoelectric bodies, the piezoelectric element may be a layered stacked body including three or more layers.

Figure 15:
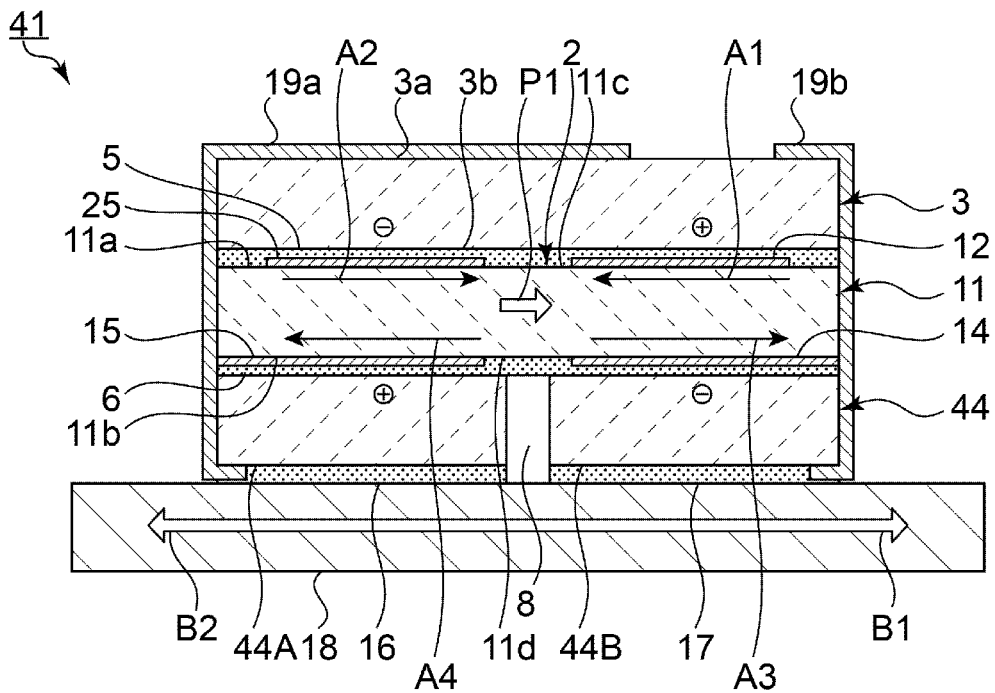
FIG. 15 is a schematic elevation cross-sectional view showing a state in which a piezoelectric deflection sensor according to a third preferred embodiment of the present invention is provided on a substrate which is a target of detection of its deflection.

FIG. 15 is a schematic elevation cross-sectional view showing a state in which a piezoelectric deflection sensor according to a third preferred embodiment of the present invention is provided on a substrate which is a target of detection of its deflection.

A piezoelectric deflection sensor 41 is different from that in the first preferred embodiment in that a second package substrate 44 is segmented into a first segmented package substrate 44A and a second segmented package substrate 44B across a groove 8. Other than thus difference, the piezoelectric deflection sensor 41 has a similar configuration to that of the piezoelectric deflection sensor 1 of the first preferred embodiment.

The groove 8 extends in a direction intersecting the polarization axis direction P1, and in the present preferred embodiment, preferably in a direction perpendicular or substantially perpendicular to the polarization axis direction P1, at a position overlapping with at least portion of the second electrode non-formation region 11d in plan view.

The groove 8 extends across the entire thickness of the second package substrate 44 in the thickness direction. Furthermore, the groove 8 extends across the entire width of the second package substrate 44 in the widthwise direction. Accordingly, the second package substrate 44 is segmented into the first segmented package substrate 44A and the second segmented package substrate 44B.

The groove 8 enables stress due to a deflection of the substrate 18 to be efficiently exerted on the first piezoelectric plate 11. Accordingly, detection efficiency of a deflection by the piezoelectric deflection sensor 41 is further improved, and charge sensitivity is further improved.

In the second package substrate 44, the groove 8 is preferably positioned at the center or approximate center in the polarization axis direction P1. Thus, stress due to a deflection of the substrate 18 is further efficiently exerted on the first piezoelectric plate 11.

Figure 16:
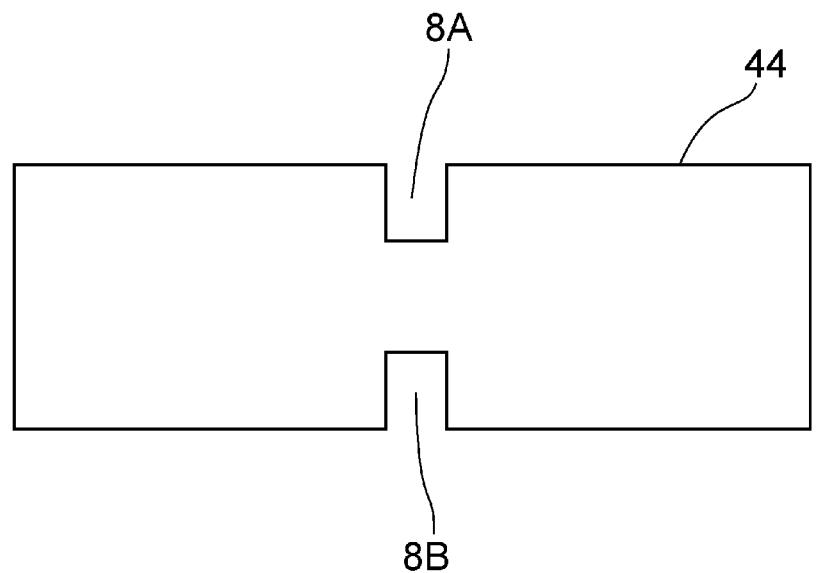
FIG. 16 is a bottom surface diagram of a second package substrate for explaining a configuration of a groove in a piezoelectric deflection sensor according to a modification of the third preferred embodiment of the present invention.

In the present preferred embodiment, the groove 8 preferably extends across the entire width in the widthwise direction so as to segment the second package substrate 44. However, the groove 8 may be shorter than the widthwise dimension of the second package substrate 44. That is, one end and the other end of the groove 8 may be positioned inwardly from one widthwise end and the other widthwise end of the second package substrate 44 in the widthwise direction. Moreover, as in a modification of the third preferred embodiment shown in FIG. 16, a groove 8A extending from one widthwise end of the second package substrate 44 and a groove 8B extending from the other widthwise end thereof may be provided.

Furthermore, in the second package substrate 44, the groove 8 may be provided so as not to extend to the principal surface of the second package substrate 44 on the piezoelectric element 2 side. That is, the groove 8 may have an arbitrary depth extending in a direction from the principal surface of the second package substrate 44 on the substrate 18 side towards the piezoelectric element 2.

Figure 17:
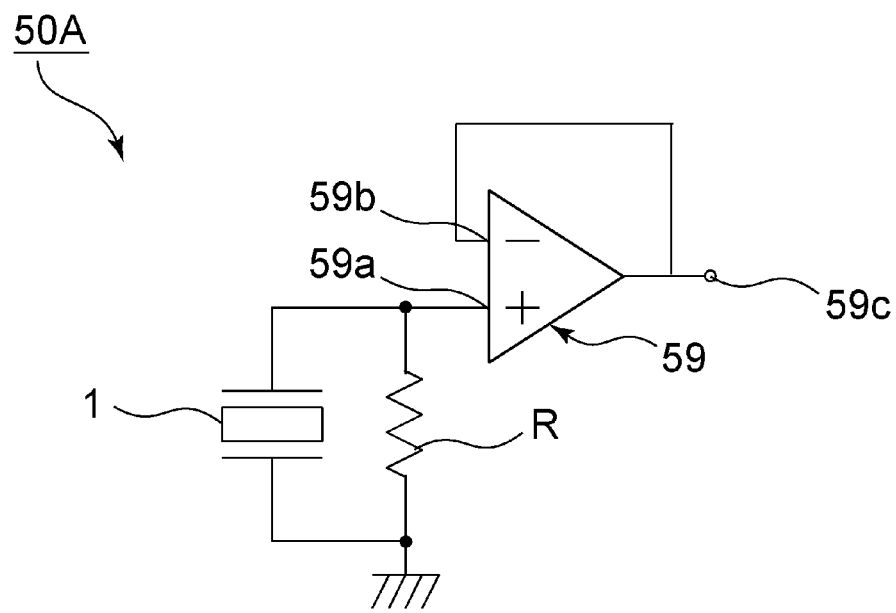
FIG. 17 is a circuit diagram of a detection device according to a fourth preferred embodiment of the present invention.

FIG. 17 is a circuit diagram of a detection device according to a fourth preferred embodiment of the present invention.

A detection device 50A includes a sensor circuit. The sensor circuit includes an operational amplifier 59. The operational amplifier 59 includes first and second input ends 59a and 59b, and an output end 59c. A piezoelectric deflection sensor 1 is connected between the first input end 59a and a ground potential. A resistor R is connected to the piezoelectric deflection sensor 1 in parallel. The second input end 59b is connected to the output end 59c. In the detection device 50A, an output of the piezoelectric deflection sensor 1 is amplified by the operational amplifier 59 to be taken out from the output end 59c.

In the present preferred embodiment, the piezoelectric deflection sensor 1 improves detection efficiency of a deflection by the detection device 50A.

In the sensor circuit of the detection device 50A, a cutoff frequency of the detection device 50A becomes lower as the capacitance of the piezoelectric deflection sensor 1 increases. Therefore, using the piezoelectric deflection sensor 1 that has a larger capacitance enables a signal in a lower frequency band to be detected. Accordingly, the detection device 50A is able to detect a deflection having a slow rate.

The detection device 50A does not require a correction circuit. Furthermore, the sensor circuit of the detection device 50A includes the piezoelectric deflection sensor 1, the resistor R, and the operational amplifier 59. Accordingly, the number of components of the detection device 50A is reduced.

Figure 18:
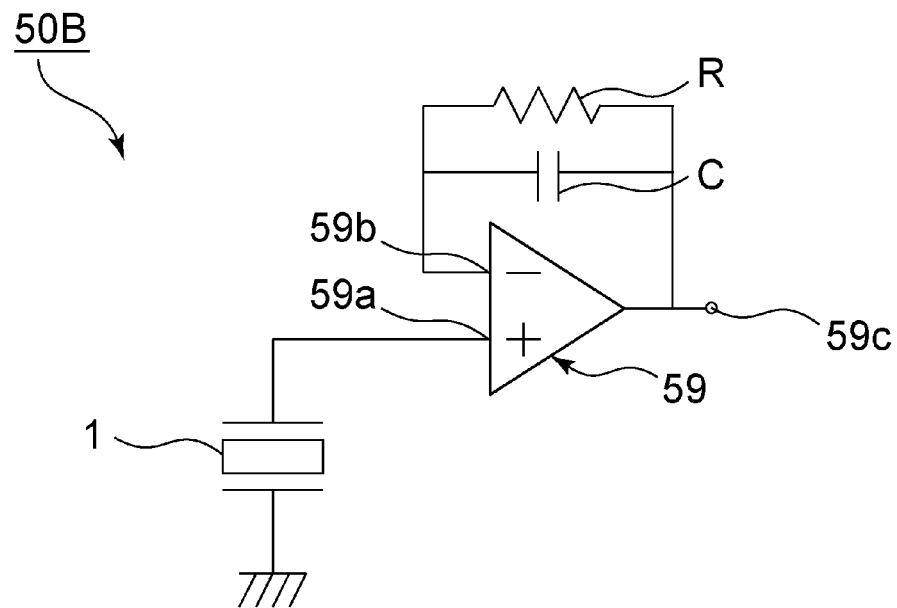
FIG. 18 is a circuit diagram of a detection device according to a fifth preferred embodiment of the present invention.

FIG. 18 is a circuit diagram of a detection device according to a fifth preferred embodiment of the present invention.

In a sensor circuit of the detection device 50B, the piezoelectric deflection sensor 1 is connected between the first input end 59a of the operational amplifier 59 and the ground potential. A capacitor C and a resistor R are connected to each other in parallel between the second input end 59b and the output end 59c.

Also in the present preferred embodiment, the piezoelectric deflection sensor 1 improves detection efficiency of a deflection by the detection device 50B similarly to the fourth preferred embodiment.

In the sensor circuit of the detection device 50B, the cutoff frequency on a lower band side is not affected by the capacitance or the insulation resistance of the piezoelectric deflection sensor 1. Therefore, a signal in a lower frequency band is able to be detected. Accordingly, the detection device 50B is able to detect a deflection having a slower rate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric deflection sensor comprising:
   a first piezoelectric plate including a first principal surface and a second principal surface opposing the first principal surface, and having a rectangular, substantially rectangular, square, or substantially square plan shape, a polarization axis direction of the first piezoelectric plate being parallel or substantially parallel to the first and second principal surfaces and extending in a direction along any side of the first piezoelectric plate;
   first and second segmented electrodes provided on the first principal surface of the first piezoelectric plate and disposed along the polarization axis direction of the first piezoelectric plate across a first electrode nonformation region extending in a direction intersecting the polarization axis direction of the first piezoelectric plate; and
   third and fourth segmented electrodes provided on the second principal surface of the first piezoelectric plate and arranged along the polarization axis direction of the first piezoelectric plate across a second electrode nonformation region extending in a direction intersecting the polarization axis direction of the first piezoelectric plate; wherein
   a piezoelectric element is defined by the first piezoelectric plate and the first to fourth segmented electrodes, and includes the first and second principal surfaces opposing each other, first and second lateral surfaces opposing each other, and first and second end surfaces opposing each other;
   the first segmented electrode and the third segmented electrode oppose each other across the first piezoelectric plate, and the second segmented electrode and the fourth segmented electrode oppose each other across the first piezoelectric plate; and
   the first segmented electrode and the fourth segmented electrode are electrically connected to each other, and the second segmented electrode and the third segmented electrode are electrically connected to each other.

2. The piezoelectric deflection sensor according to claim 1, further comprising:
   a first external electrode electrically connecting the first segmented electrode and the fourth segmented electrode to each other; and
   a second external electrode electrically connecting the second segmented electrode and the third segmented electrode to each other.

3. The piezoelectric deflection sensor according to claim 1, wherein the first and second electrode non-formation regions extend in a direction perpendicular or substantially perpendicular to the polarization axis direction of the first piezoelectric plate.

4. The piezoelectric deflection sensor according to claim 1, wherein the first to fourth segmented electrodes are not exposed from the first or second lateral surfaces of the piezoelectric element.

5. The piezoelectric deflection sensor according to claim 1, wherein
the piezoelectric element includes a second piezoelectric plate stacked on the first piezoelectric plate; and
a polarization axis direction of the second piezoelectric plate is a reverse direction to the polarization axis direction of the first piezoelectric plate, and fifth and sixth segmented electrodes disposed along the polarization axis direction of the second piezoelectric plate across a third electrode non-formation region extending in a direction intersecting the polarization axis direction of the second piezoelectric plate are provided on an opposite surface of the second piezoelectric plate, to a surface thereof on the first piezoelectric plate side.

6. The piezoelectric deflection sensor according to claim 1, wherein a package substrate is stacked on at least one of the first principal surface and the second principal surface of the piezoelectric element.

7. The piezoelectric deflection sensor according to claim 6, wherein
the package substrate includes first and second package substrates; and
the first package substrate is stacked on the first principal surface of the piezoelectric element, and the second package substrate is stacked on the second principal surface of the piezoelectric element.

8. The piezoelectric deflection sensor according to claim 7, wherein a groove extending in a direction intersecting the polarization axis direction of the first piezoelectric plate is provided in the second package substrate at a position overlapping with at least a portion of the second electrode non-formation region in plan view.

9. The piezoelectric deflection sensor according to claim 8, wherein the groove extends in a direction perpendicular or substantially perpendicular to the polarization axis direction of the first piezoelectric plate.

10. The piezoelectric deflection sensor according to claim 9, wherein the groove is positioned at a center or an approximate center in the polarization axis direction of the first piezoelectric plate in the second package substrate.

11. A detection device comprising:
a sensor circuit including an operational amplifier having first and second input ends and an output end; and
the piezoelectric deflection sensor according to claim 1; wherein
the piezoelectric deflection sensor is connected to the first input end of the operational amplifier.

12. The detection device according to claim 11, wherein the piezoelectric deflection sensor further includes:
a first external electrode electrically connecting the first segmented electrode and the fourth segmented electrode to each other; and
a second external electrode electrically connecting the second segmented electrode and the third segmented electrode to each other.

13. The detection device according to claim 11, wherein the first and second electrode non-formation regions extend in a direction perpendicular or substantially perpendicular to the polarization axis direction of the first piezoelectric plate.

14. The detection device according to claim 11, wherein the first to fourth segmented electrodes are not exposed from the first or second lateral surfaces of the piezoelectric element.

15. The detection device according to claim 11, wherein
the piezoelectric element includes a second piezoelectric plate stacked on the first piezoelectric plate; and
a polarization axis direction of the second piezoelectric plate is a reverse direction to the polarization axis direction of the first piezoelectric plate, and fifth and sixth segmented electrodes disposed along the polarization axis direction of the second piezoelectric plate across a third electrode non-formation region extending in a direction intersecting the polarization axis direction of the second piezoelectric plate are provided on an opposite surface of the second piezoelectric plate, to a surface thereof on the first piezoelectric plate side.

16. The detection device according to claim 11, wherein a package substrate is stacked on at least one of the first principal surface and the second principal surface of the piezoelectric element.

17. The detection device according to claim 16, wherein
the package substrate includes first and second package substrates; and
the first package substrate is stacked on the first principal surface of the piezoelectric element, and the second package substrate is stacked on the second principal surface of the piezoelectric element.

18. The detection device according to claim 17, wherein a groove extending in a direction intersecting the polarization axis direction of the first piezoelectric plate is provided in the second package substrate at a position overlapping with at least a portion of the second electrode non-formation region in plan view.

19. The detection device according to claim 18, wherein the groove extends in a direction perpendicular or substantially perpendicular to the polarization axis direction of the first piezoelectric plate.

20. The detection device according to claim 19, wherein the groove is positioned at a center or an approximate center in the polarization axis direction of the first piezoelectric plate in the second package substrate.

* * * * *